(12) United States Patent
Jeddeloh

(10) Patent No.: US 6,401,213 B1
(45) Date of Patent: *Jun. 4, 2002

(54) TIMING CIRCUIT FOR HIGH SPEED MEMORY

(75) Inventor: Joseph M. Jeddeloh, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/349,816

(22) Filed: Jul. 9, 1999

(51) Int. Cl.[7] .................................................. G06F 1/04
(52) U.S. Cl. ...................................... 713/401; 713/503
(58) Field of Search ................................ 713/400, 401, 713/500, 503, 600

(56) References Cited

U.S. PATENT DOCUMENTS

| | | | |
|---|---|---|---|
| 4,965,884 A | * 10/1990 | Okura et al. | 375/354 |
| 5,926,838 A | * 7/1999 | Jeddeloh | 711/167 |
| 5,978,891 A | * 11/1999 | Takeda | 711/167 |
| 6,052,329 A | * 4/2000 | Nishino et al. | 365/233 |
| 6,122,688 A | * 9/2000 | Barth et al. | 710/100 |

* cited by examiner

*Primary Examiner*—Dennis M. Butler
(74) *Attorney, Agent, or Firm*—Trop, Pruner & Hu, P.C.

(57) ABSTRACT

A timing circuit to adjust a data strobe signal received from a synchronous memory includes a delay circuit to adjustably delay the data strobe signal and to generate a delayed data strobe signal, a clock capture register to sample the delayed data strobe signal and to generate a sampled clock signal, a data capture register to sample a read data signal from the synchronous memory and to generate a sampled data signal, and an analysis circuit to determine a timing relationship between the sampled clock signal and the sampled data signal and to adjust the delay circuit based on the determined timing relationship. By way of example, the determined timing relationship may be used to delay the read data strobe signal so that it transitions (e.g., from a low state to a high state) in the middle of the data signal's data eye.

27 Claims, 8 Drawing Sheets

TIMING CIRCUIT FOR HIGH SPEED MEMORY

BACKGROUND

The invention relates generally to computer system memories and more particularly, but not by way of limitation, to the control of data access operations in a computer memory system using synchronous dynamic random access memory devices.

There are a number of different types of integrated circuit memories commercially available. The most widely used type of memory is dynamic random access memory (DRAM). In a DRAM device, individual memory cells within a two-dimensional array are accessed by a combination of row address (often referred to as a page) and column address signals. Different types of DRAM devices provide different methods of reading data from and writing data to the memory array. In a page mode DRAM, for example, once a page has been addressed, any number of different memory cells within that page (i.e., memory cells having different column addresses) may be accessed sequentially without needing to readdress the already selected page. Another type of DRAM device is the extended data output (EDO) DRAM. In an EDO DRAM device, once a page has been selected and an initial column specified, additional columns may be automatically accessed (in a predetermined manner) without having to provide additional column addresses on the memory's external address pins.

Many current computer systems require memory access rates beyond those supported by page mode and EDO DRAM devices. One approach to improved memory access performance was to synchronize the memory device with the computer system's master clock. This type of memory is known as synchronous DRAM (SDRAM).

Another technique for improving memory access speed is for the memory device to use a separate data clock signal (often referred to as a data strobe signal or, more simply, a data strobe) to facilitate memory read and write operations. Memories of this type receive and use a data strobe during memory write operations, and generate and transmit a data strobe during memory read operations. To further increase memory system throughput or bandwidth, many current memory devices transfer data on both the rising and falling edges of the data strobe signal. Examples of this latter type of DRAM include double data rate (4R), RAMBUS®, and Synclink (SLDRAM) memory devices. The 4R standard is available from the Joint Electron Device Engineering Counsel (JEDEC), as document JESD-21-C. The RAMBUS® standard is published by Rambus, Incorporated of Mountain View, Calif. The Synclink standard has been assigned the preliminary designation P1596.7 by the Microprocessor & Microcomputer Standards Committee (MMSC) of the Institute of Electrical and Electronics Engineers (IEEE).

While SDRAM, 4R, RAMBUS®, and SLDRAM technologies provide the promise of increased memory system bandwidth, is also places severe constraints on the memory controller which coordinates the transfer of data between the memory and the computer system proper (e.g., a computer system's central processing unit). For example, the high data transfer rates supported by SDRAM devices mean that operational margins (e.g., the tolerance or variability between the data strobe and data signals) are measured in picoseconds ($10^{-12}$ seconds) rather than nanoseconds ($10^{-9}$ seconds) as in prior memory devices. Thus, it would be beneficial to provide a mechanism to maintain a precise clocking window for data access operations in high speed synchronous memory devices.

SUMMARY

In one embodiment the invention provides a timing circuit to adjust a data strobe signal received from a synchronous memory. The circuit includes a delay circuit to adjustably delay the data strobe signal and to generate a delayed data strobe signal, a clock capture register to sample the delayed data strobe signal and to generate a sampled clock signal, a data capture register to sample a read data signal from the synchronous memory and to generate a sampled data signal, and an analysis circuit to determine a timing relationship between the sampled clock signal and the sampled data signal and to adjust the delay circuit based on the determined timing relationship. By way of example, the determined timing relationship may be used to delay the read data strobe signal so that it transitions (e.g., from a low state to a high state) in the middle of the data signal's data eye. The timing circuit may, for example, be implemented as a separate memory control/monitoring device, or incorporated within an existing computer system memory controller.

In another embodiment, the invention provides a method to adjust a data strobe signal. The method includes receiving a read data strobe signal and a data signal from a synchronous memory device during a memory read operation, determining a timing characteristic between the read data strobe signal and the data signal, and delaying the read data strobe signal based on the measured timing characteristic. The method may be stored in any media that is readable and executable by a computer system. Alternatively, the method may be embodied in a custom designed hardware device such as an application specific integrated circuit, or implemented as a combination of software (computer executable instructions) and hardware.

DETAILED DESCRIPTION

Techniques (including methods and devices) to regulate the transfer of data to and from a synchronous dynamic random access memory are described. The following embodiments of the invention are illustrative only and are not to be considered limiting in any respect.

Figure 1:
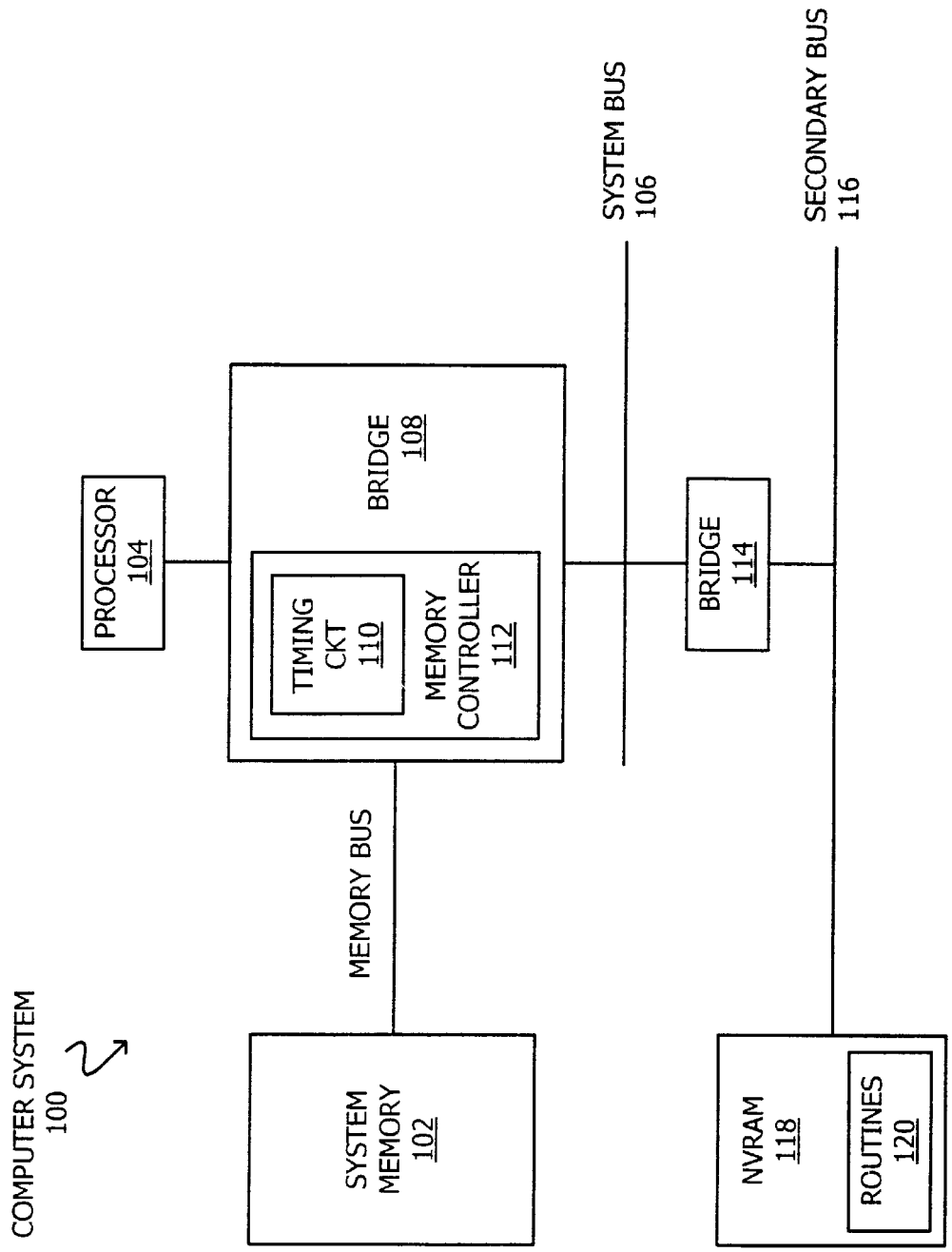
FIG. 1 shows a block diagram of a computer system in accordance with one embodiment of the invention.

A block diagram of a computer system incorporating a timing circuit in accordance with one embodiment of the invention is depicted in FIG. 1. Computer system 100 includes system memory 102 coupled to processor 104 and system bus 106 via bridge circuit 108. In the embodiment illustrated in FIG. 1, timing circuit 110 is a component of memory controller 112 which itself is a component of bridge circuit 108.

Timing circuit 110, alone or in combination with other circuits such as memory controller 112, measures a timing relationship between the data and data strobe signals generated by system memory 102 during a memory read operation. The measured relationship may be used to adjust memory controller 112's internal sampling of incoming data signals. For instance, the memory's data strobe signal may be delayed (based on the measured timing relationship) so as to place it in the center of the data signal's data eye—that time period during which a data signal is valid. In one embodiment, timing circuit 110 measures the timing relationship between data and data strobe signals every N microseconds (e.g., 5 to 15 microseconds). In another embodiment, timing circuit 110 measures the timing relationship between data and data strobe signals once every memory refresh cycle. In yet another embodiment, timing circuit 110 measures the timing relationship between data and data strobe signals when the memory controller's memory read circuit goes idle. In still another embodiment, timing circuit 110 measures the timing relationship between data and data strobe signals on computer system power-up and reset operations.

As shown in FIG. 1, computer system 100 may also include secondary bus bridge circuit 114 coupling system bus 106 to secondary bus 116 and non-volatile storage device 118 (having software routines 120 stored therein; see discussion below). Illustrative processors (e.g., processor 104) include the PENTIUM® processor and 80×86 family of processors from Intel Corporation. An illustrative system bus (e.g., bus 106) is one operated in conformance with the Peripheral Component Interconnect (PCI) specification. An illustrative secondary bus bridge circuit (e.g., bridge circuit 114) is the P8×4 PCI-to-ISA/IDE accelerator chip from Intel Corporation. Illustrative secondary buses (e.g., bus 116) include those bus structures operated in conformance with the Low Pin Count (LPC) interface, Industry Standard Architecture (ISA) and Extended Industry Standard Architecture (EISA) standards. Illustrative non-volatile memory devices (e.g., NVRAM 118) include read only memory (ROM), electrically programmable read only memory (EPROM), electrically erasable programmable read only memory (EEPROM), flash memory, and complementary metal oxide semiconductor (CMOS) memory. It will be recognized that each of the elements of FIG. 1 are typically embodied in or affixed to a printed circuit board, often referred to as a motherboard.

Figure 2:
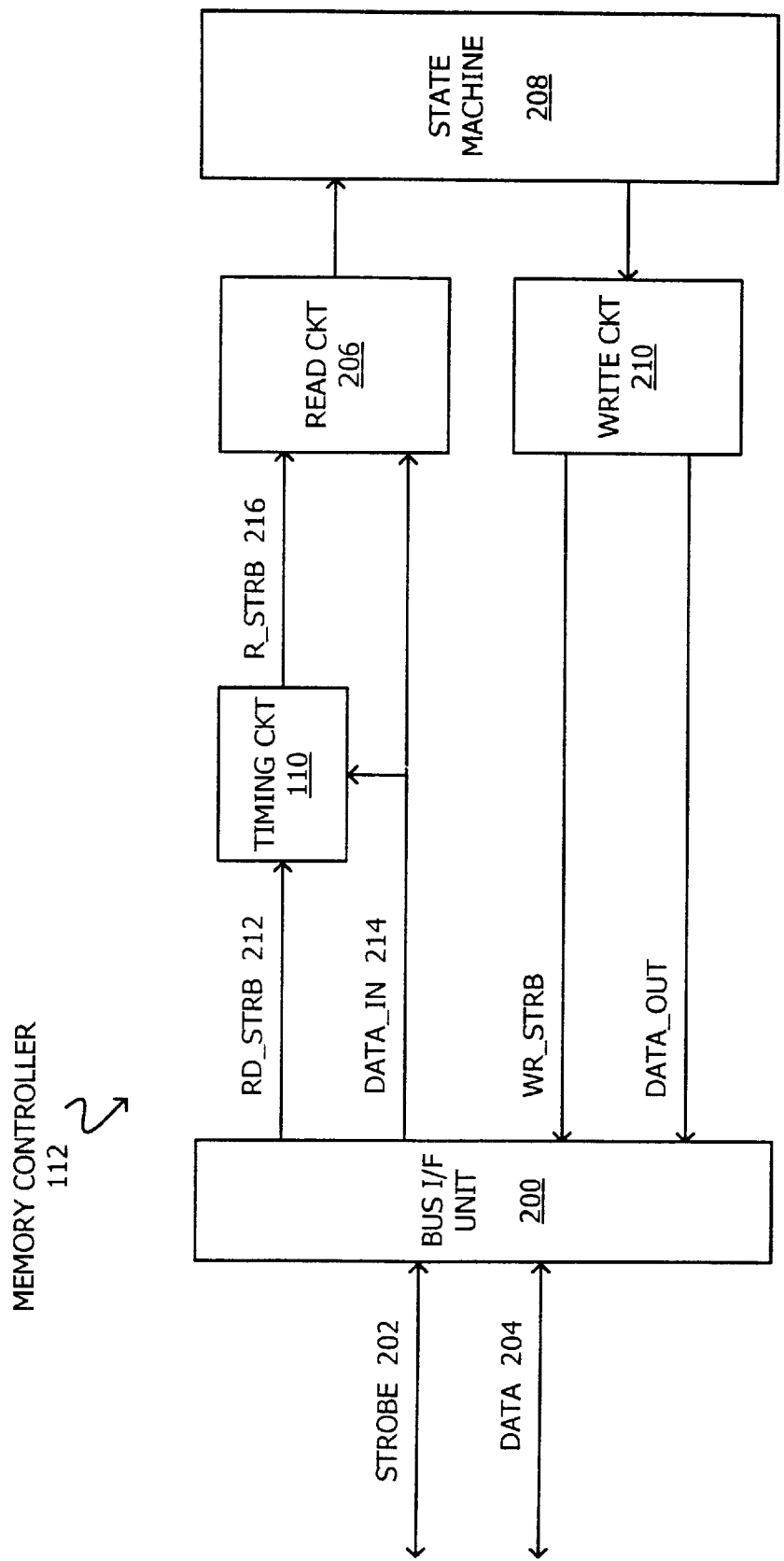
FIG. 2 shows a block diagram of a memory controller in accordance with FIG. 1.

Referring to FIG. 2, memory controller 112 in accordance with one embodiment of the invention includes memory interface unit 200 that couples strobe signal 202, data signals 204 and other memory bus signals (not shown) to internal memory controller circuitry. As in a conventional memory controller, read circuit 206 controls the flow of data from system memory 102, and write circuit 210 controls the flow of data to system memory 102. Timing circuit 110 is positioned so that it may determine a timing relationship between read data strobe signal 212 and one or more incoming data signals 214. Based on the determined timing relationship, timing circuit 110 generates a modified read strobe signal 216 to better enable read circuit 206 to capture incoming data 214.

Figure 3:
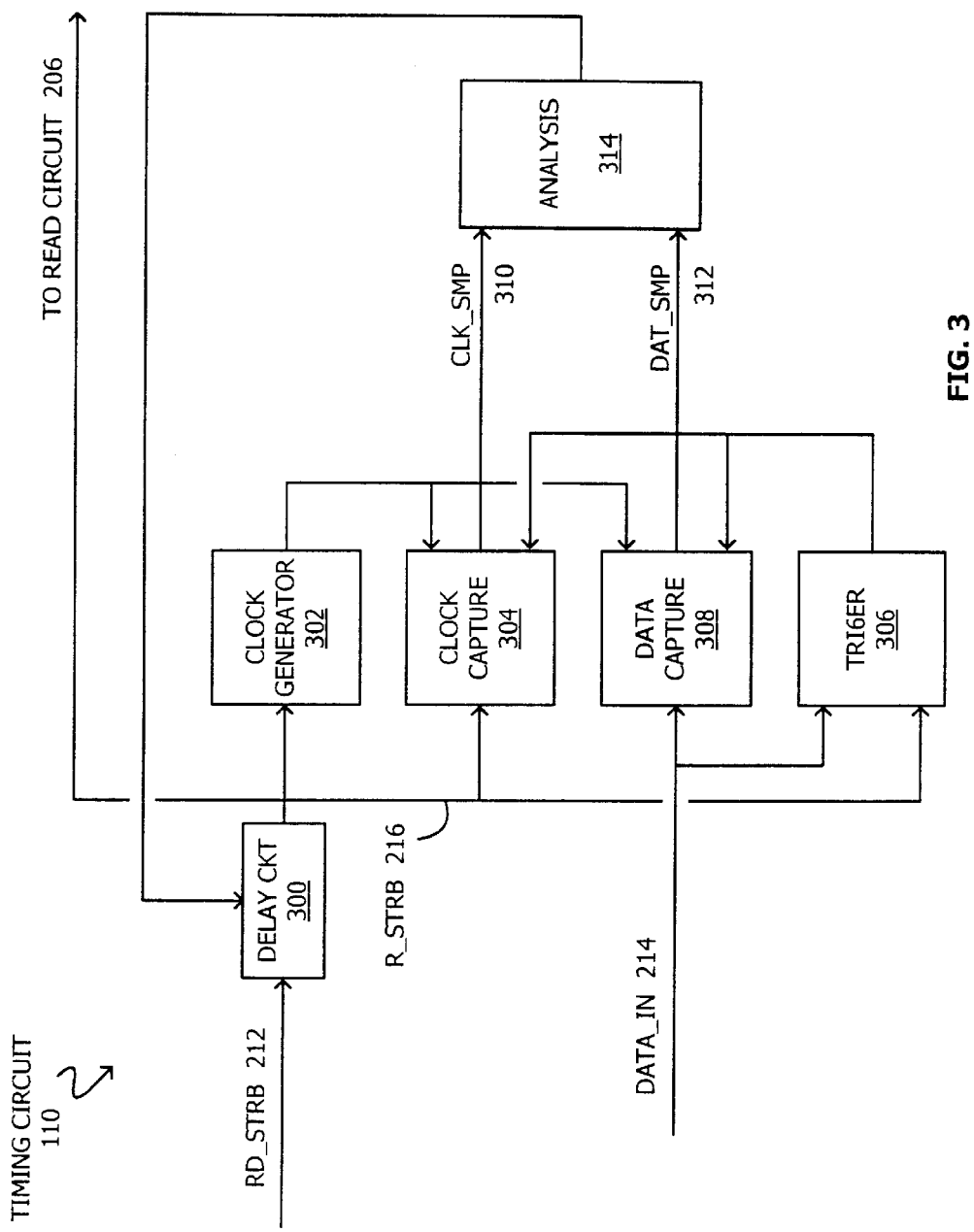
FIG. 3 shows a block diagram of a timing circuit in accordance with FIGS. 1 and 2.

A block diagram of one embodiment of timing circuit 110 is shown in FIG. 3. Incoming read data strobe signal 212 (from bus interface unit 200 of FIG. 2) is routed through delay circuit 300. Delay circuit 300 delays read data strobe signal 212 by a specified, but adjustable, amount of time—generally between 0 (zero) seconds and an amount of time approximately equal to the period of memory bus strobe signal 202. A programmable or adjustable delay circuit may be implemented in a variety of ways. For example, using a combination of inverters, MUXs (multiplexors) and/or inverting MUXs. Output from delay circuit 302 is routed to read circuit 206 (see FIG. 2), clock generator 302, clock capture circuit 304 and trigger 306 circuit. In addition, at least one of data signals 214 is routed to trigger circuit 306 and data capture circuit 308.

Generally speaking, clock generator 302 provides a series of signals that are used by clock capture 304 and data capture 308 circuits to record a predetermined number of samples of their input signal (modified read strobe 216 and data input signal 214 respectively). The sampled signals 310 and 312 are coupled to analysis circuit 314. Analysis circuit 314, in turn, determines how much to delay read data strobe 212 so that modified read strobe 216's edge (i.e., transition from a high state to a low state, or a low state to a high state) is in the center of the data eye.

Figure 4:
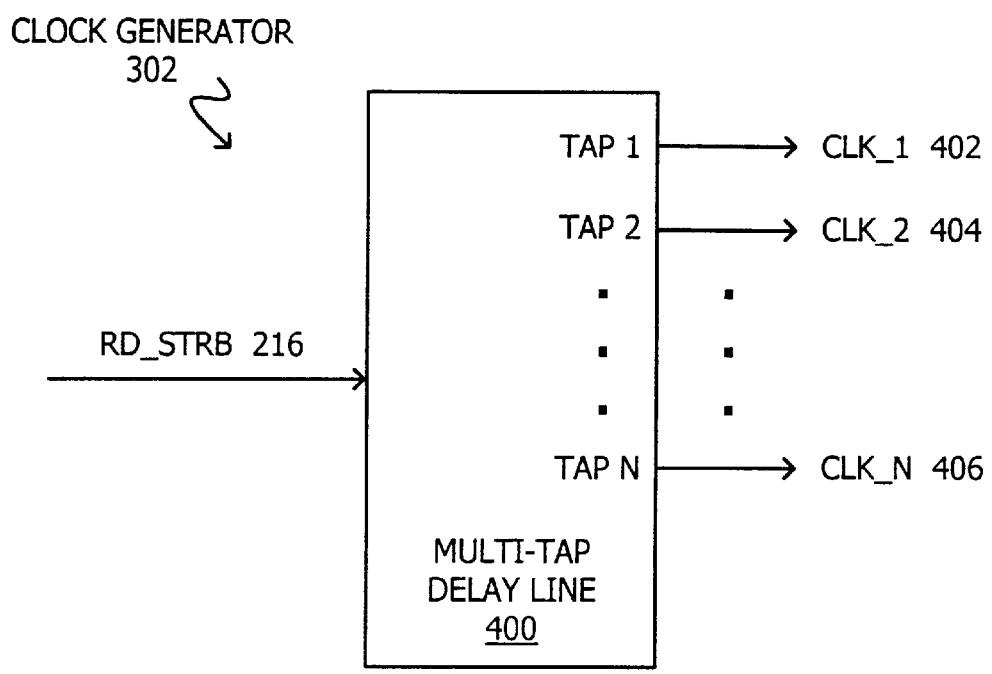
FIG. 4 shows a block diagram of a clock generator circuit in accordance with FIG. 3.

As shown in FIG. 4 clock generator circuit 302 may be implemented using multi-tapped delay line 400, where each tap delays signal 216 a specified amount of time. For example, tap-1 may delay read strobe 216 200 picoseconds to produce CLK_1 signal 402, tap-2 may delay read strobe 216 400 picoseconds to produce CLK_2 signal 404, and tap-N may delay read strobe 216 (N×200) picoseconds to produce CLK_N signal 406. In one embodiment, N is chosen to approximate the time period of memory bus strobe signal 202. Thus, if strobe signal 202 has a minimum period of 5 to 6 nanoseconds, N may be chosen to be 32 such that the total delay from tap-1 to tap-32 is 6.4 nanoseconds.

Figure 5:
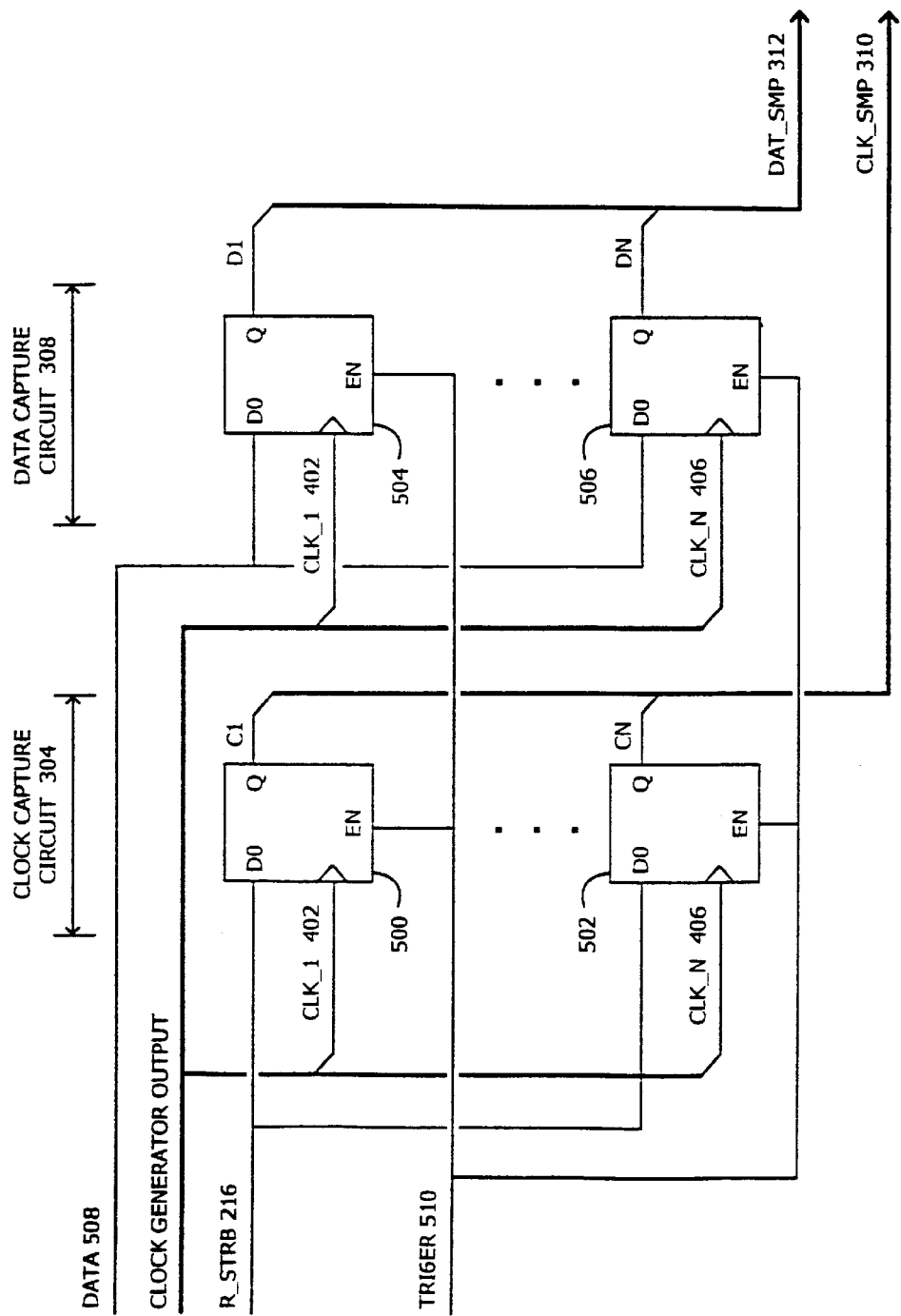
FIG. 5 shows a block diagrams of clock capture and data capture circuits in accordance with FIG. 3.

Referring to FIG. 5, an expanded block diagram of clock capture 304 and data capture 308 circuits are shown. Clock capture circuit 304 includes N single-bit registers (e.g., 500 and 502). Similarly, data capture 308 circuit includes N single-bit registers (e.g., 504 and 506). As shown, each single bit register is driven by a corresponding clock generator output: CLK_1 402 drives clock capture register 500 and data capture register 504 and CLK_N 406 drives clock capture register 502 and data capture register 506. Modified read strobe signal 216 provides data input to each of the N clock capture single bit registers and a selected one of data input signals 508 (e.g., data bit 0) provides data input to each of the N data capture single bit registers. In one embodiment, clock capture 304 and data capture 308 circuits free run until disabled by trigger signal 510 (generated by trigger circuit 306, see discussion below). On being disabled by trigger signal 510, clock capture 304 and data capture 308 registers retain their current input state. Clock capture circuit output 310 and data capture circuit output 312 is routed to analysis circuit 314 for determination of their timing relationship (see discussion below).

Figure 6:
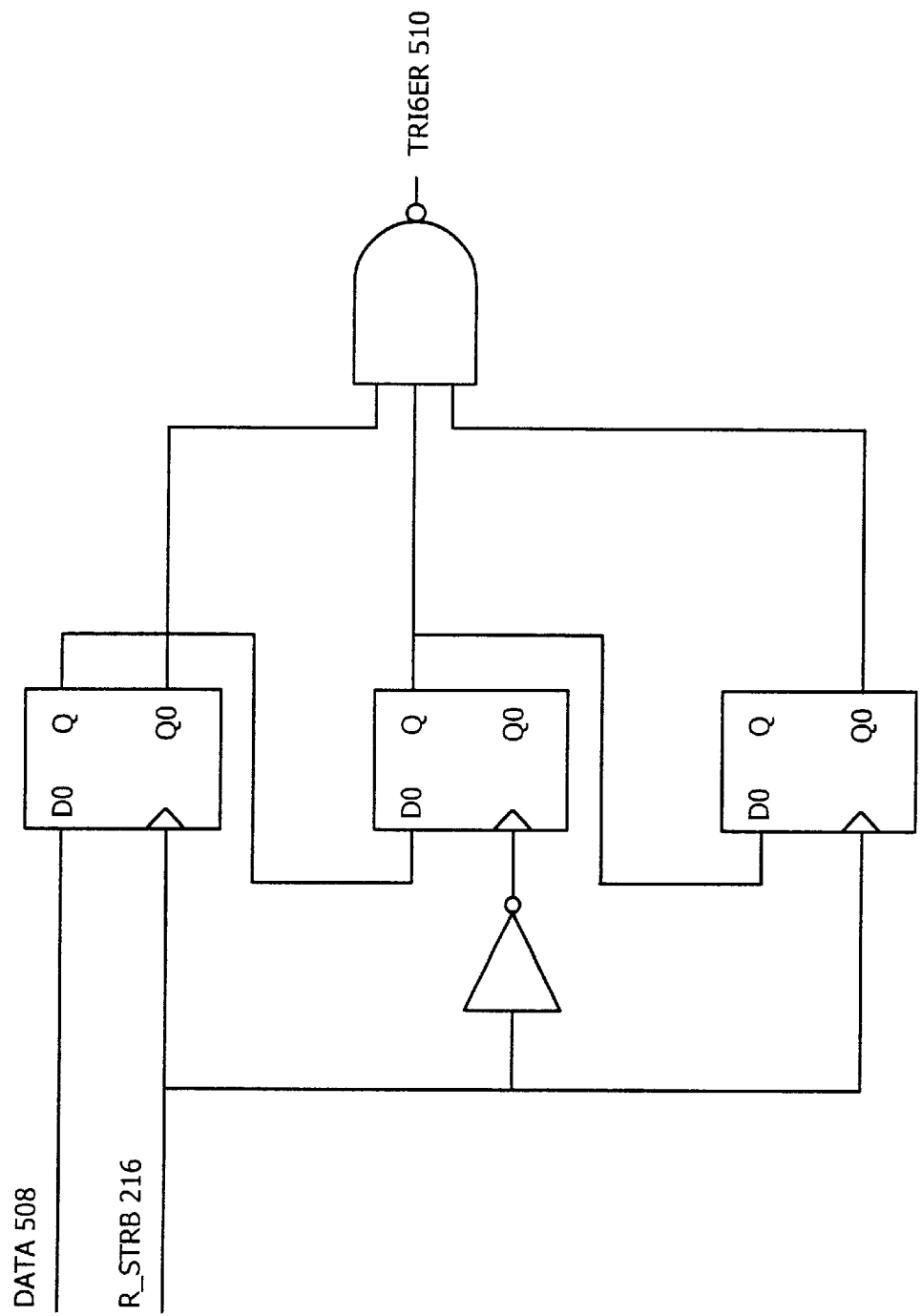
FIG. 6 shows a block diagram of a trigger circuit in accordance with one embodiment of the invention.

Turning now to trigger circuit 306, its basic function is to monitor a selected one or more of data input signals 214 (e.g., data bit 0 from system memory 102) for a specified sequence and, when that sequence is detected, generate an appropriate output signal to clock capture and data capture registers 304 and 308 as discussed above. In the illustrative trigger circuit of FIG. 6, the specified pattern on the selected data bit 508 signal is <0 1 0>. While virtually any pattern may be used, <0 1 0> or <1 0 1> patterns are short and allow the capture of two data signal transitions (low-to-high-to-low or high-to-low-to-high). In the embodiment of FIG. 6, trigger signal 510 is asserted low to disable clock capture 304 and data capture 308 circuits.

It will be recognized that trigger circuit 306 may be enabled by analysis circuit 314 (or another circuit such as memory controller state machine 208) so that a timing relationship between the memory system's data strobe 202 and data signals 204 is determined only at predetermined times. Alternatively, trigger circuit 306 may capture and route data to analysis circuit 314 on a continuous basis. However, analysis circuit 314 may disregard input from clock 304 and data 308 capture circuits until a specified time.

Analysis circuit 314 may determine a timing characteristic between the modified read data strobe signal 216 (and, consequently, read data strobe signal 212 generated by the memory 102) and one or more of the read data signals 214. For example, analysis circuit 314 may compare clock capture circuit output 310 and data capture circuit output 312 (e.g., an exclusive-or operation) to determine where during selected data signal 508 the modified read data strobe signal transitions. Because data is typically sampled/latched by memory controller 112 only on a clock edge, it is beneficial that this transition occur in the middle of the data signal's data eye. By determining where in the data eye modified read data strobe signal 216 transitions, analysis circuit 314 may adjust the amount of delay imparted by delay circuit 300 to read data strobe signal 212. In this way, the edge of modified read data strobe signal 216 may be adjusted so that it is placed approximately in the middle of the data signal's data eye.

Figure 7:
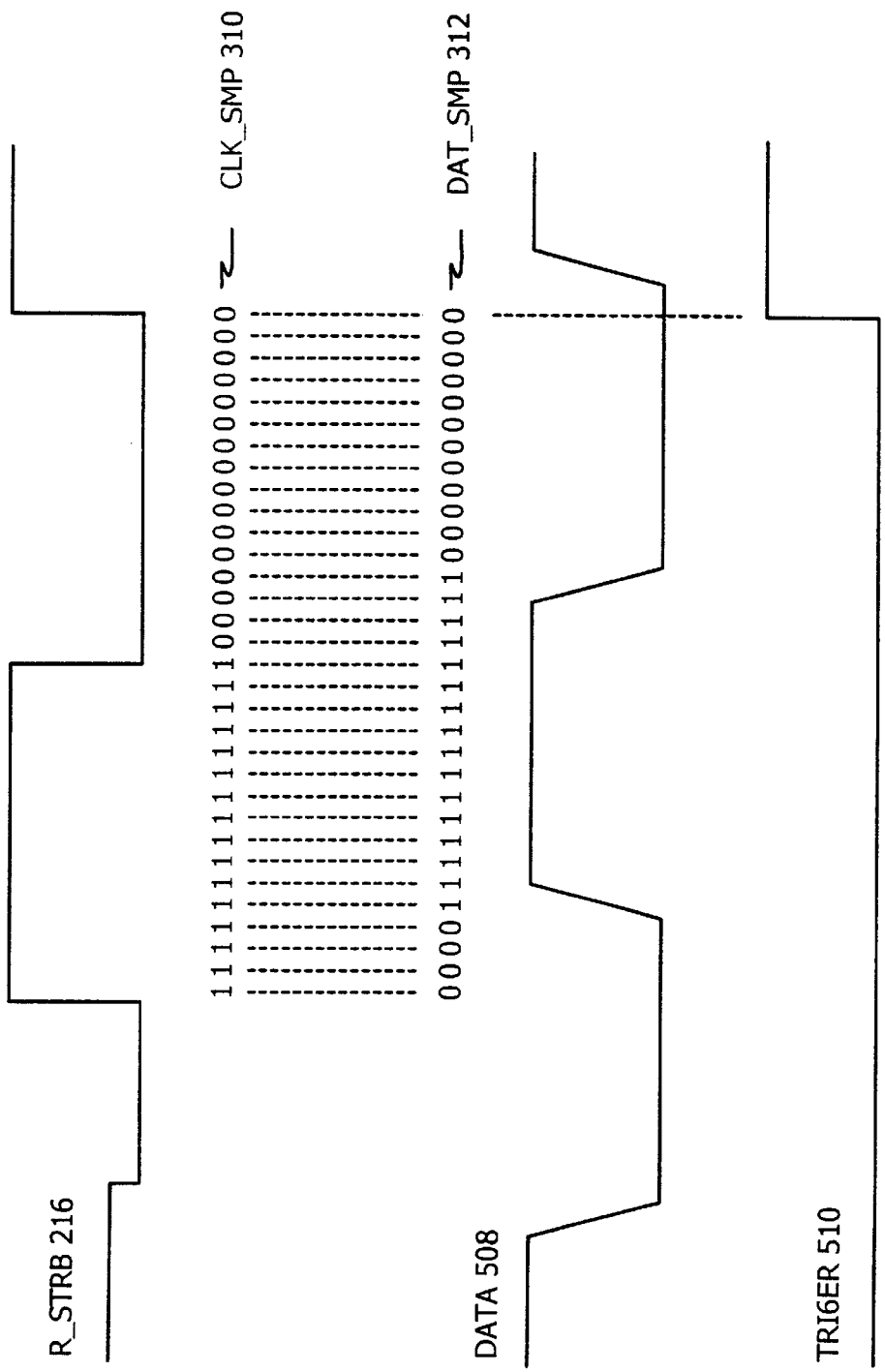
FIG. 7 shows read strobe, data and trigger signals in accordance with one embodiment of the invention.

By way of example, consider modified read data strobe 216, selected data signal 508, and trigger signal 510 as shown in FIG. 7. (In this example, trigger circuit 306 is designed to detect a <1 0 1> pattern on a selected one (508) of the read input data signals 214. The numbers '1' and '0' below modified read strobe signal 216 represent the digital value captured by clock capture circuit 304 (i.e., signal 310 of FIGS. 3 and 5). The numbers '1' and '0' above data signal 508 represent the digital value captured by data capture circuit 306 (i.e., signal 312 of FIGS. 3 and 5). Analysis circuit 314 may compare clock and data capture circuit output signals 310 and 312 to determine where in the data eye modified read strobe signal 216 transitions. Based on the illustrative signals of FIG. 7 for example, analysis circuit 314 may determine that the data eye is approximately 16 sample periods in length (indicated by the run of 16 '1' values in data sample signal 312), and that the data clocking signal (i.e., modified read strobe signal 216) transitions 12 sample periods into the data eye. Thus, modified read strobe signal 216 may be delayed a time equal to 4 sample periods to place it in the middle of the data eye. This adjustment may be made by analysis circuit 314 by generating an appropriate signal to delay circuit 300 (see FIG. 3). It will be recognized that analysis circuit 314 may be a custom designed state machine (implemented as part of memory controller 112, for example). Alternatively, analysis circuit 314 may be functionally implemented through program instructions executed by processor 104 (in response to a periodic system management interrupt, for example).

Referring again to FIG. 1, routines 120 include basic input-output system (BIOS) routines that are executed during computer system 100 power-up or reset operations. In one embodiment, routines 120 initialize delay circuit 300 see FIG. 3) to provide 0 (zero) delay. In addition, routines 120 may write to memory controller configuration space (typically, random access memory within memory controller 112) to indicate the clock speed and other timing characteristics (e.g., setup and hold times) of system memory 102, and to establish when read strobe signal modifications are to be made (e.g., once every M microseconds, on read circuit 206 going idle, on memory refresh, etc). Analysis circuit 314 may use this information to adjust modified read strobe 216 via delay circuit 300.

Figure 8:
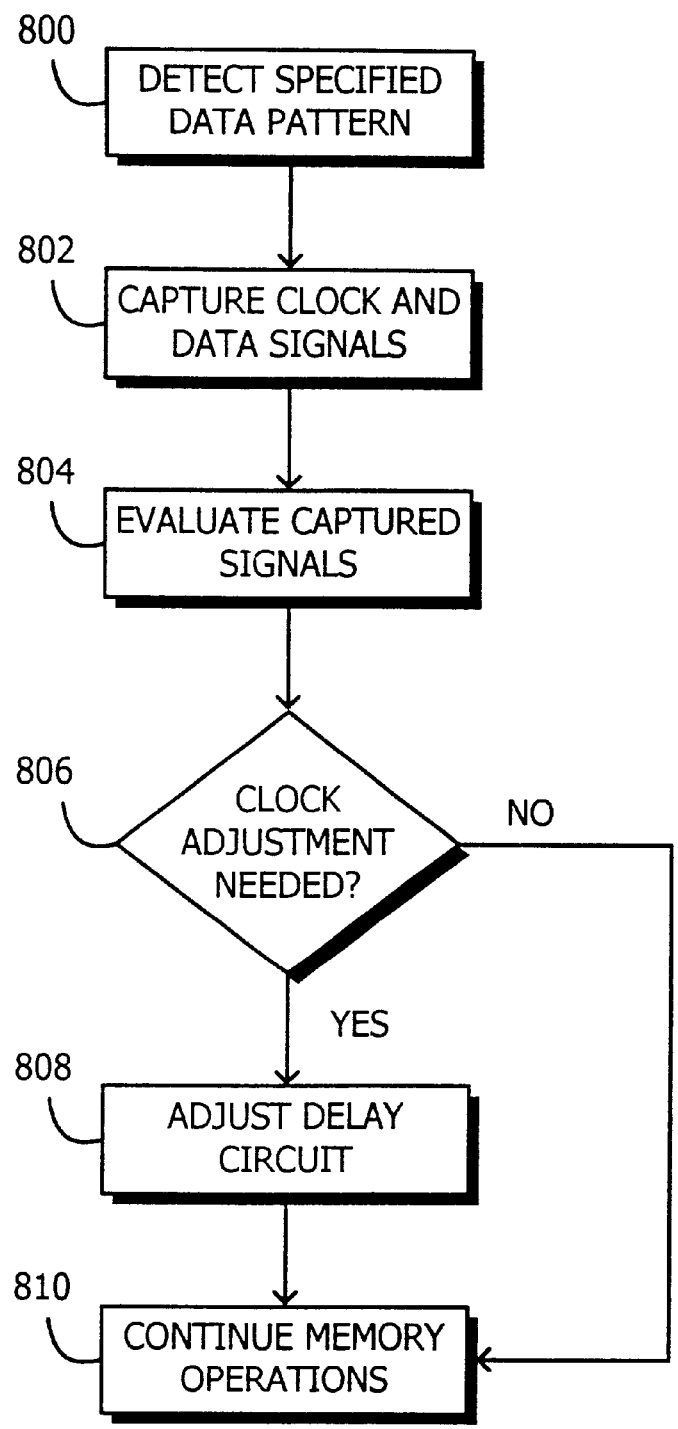
FIG. 8 shows a flowchart of timing circuit behavior in accordance with one embodiment of the invention.

The general behavior of timing circuit 110 may be described in flowchart form as shown in FIG. 8. Once initialized (see discussion above), timing circuit waits until it is activated. For example, timing circuit 110 may remain dormant until activated through a hardware timer, a system management interrupt, indication of a memory refresh operation completing, or indication of read circuit 206 going idle. Once activated, trigger circuit 306 generates trigger signal 510 when a predetermined pattern is observed on one or more data signals 508 (block 800). Trigger signal 510 causes clock capture 304 and data capture 308 circuits to capture their respective inputs (block 802). Captured clock and data signals are evaluated by analysis circuit 314 (block 804). If the read strobe signal needs to be delayed to place it's edge in the middle of the captured data eye (the 'yes' prong of diamond 806), analysis circuit 314 indicates this to delay circuit 300 (block 808), thereinafter normal memory processing continues (block 810). If the read strobe signal's edge is already approximately in the middle of the captured data signal's data eye (the 'no' prong of diamond 806), no adjustment is made and normal memory processing continues (block 810).

Various changes in the materials, components, circuit elements, as well as in the details of the illustrated operational method are possible without departing from the scope of the claims. For instance, it will be recognized that there is a design tradeoff between the number of delay steps provided by delay line 400, the amount of delay introduced by each stage of delay line 400, and the resolution of the sampled strobe and data signals 310 and 312. For example, is the shorter the delay associated with each tap of delay line 400, the more clock capture and data capture registers are required to obtain a complete strobe clock cycle. The increased number of capture registers requires additional hardware (and silicon area if implemented in a, for example, application specific integrated circuit or ASIC). However, the increased temporal resolution afforded by this arrangement allows analysis circuit 314 to more accurately place modified read strobe signal 216's edge in the center of the data eye. In addition, trigger circuit 306 may be a custom designed and fixed detection circuit (FIG. 6), or it may be a programmable unit wherein memory controller 112 or BIOS routine 120 loads/stores a value that determines the pattern which generates a trigger signal.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. A timing circuit to adjust a data strobe signal received from a synchronous memory, the timing circuit comprising:

a delay circuit to adjustably delay the data strobe signal and to generate a delayed data strobe signal;

a clock capture register to sample the delayed data strobe signal and to generate a sampled clock signal;

a data capture register to sample a read data signal from the synchronous memory and to generate a sampled data signal; and an analysis circuit to determine a timing relationship between the sampled clock signal and the sampled data signal and to adjust the delay circuit based on the determined timing relationship.

2. The timing circuit of claim 1, wherein the delay circuit comprises a programmable delay line.

3. The timing circuit of claim 2, wherein the delay line provides a delay of between approximately zero seconds and a time approximately equal to a period of the data strobe signal.

4. The timing circuit of claim 1, further comprising a clock generator to generate a plurality of clock signals from the delayed data strobe signal, a first portion of said plurality of clock signals coupled to the clock capture register and a second portion of said plurality of clock signals coupled to the data capture register.

5. The timing circuit of claim 4, wherein the clock generator comprises an N-tap delay line, each tap providing one of the plurality of clock signals.

6. The timing circuit of claim 5, wherein the first portion and the second portion of said plurality of clock signals comprise all N clock signals.

7. The timing circuit of claim 6, wherein the clock capture register comprises N storage elements to generate an N-bit sampled clock signal, each of the N storage elements being driven by a corresponding one of the N clock signals from the clock generator.

8. The timing circuit of claim 6, wherein the data capture register comprises N storage elements to generate an N-bit sampled data signal, each of the N storage elements being driven by a corresponding one of the N clock signals from the clock generator.

9. The timing circuit of claim 6, further comprising a trigger circuit to generate a trigger signal, the trigger signal causing the clock capture register to generate the sampled clock signal and the data capture register to generate the sampled data signal.

10. The timing circuit of claim 9, wherein the trigger signal is generated when a specified pattern is detected by the trigger circuit on the read data signal.

11. The timing circuit of claim 10, wherein the specified pattern comprises a high-to-low-to-high transition or a low-to-high-to-low transition.

12. The timing circuit of claim 11, wherein the analysis circuit determines when the delayed data strobe signal transitions with respect to the low-to-high transition of the read data signal.

13. The timing circuit of claim 12, wherein the analysis circuit causes the delay circuit to delay the data strobe signal so that the delayed data strobe signal transitions from a low state to a high state approximately in the middle of a data eye of the read data signal.

14. A computer system motherboard comprising:
a processor socket adapted to receive a processor module;
at least one memory socket adapted to receive a memory module;
a bridge circuit coupled to the processor socket and the at least one memory socket, the bridge circuit having a timing circuit in accordance with claim 1.

15. The computer system motherboard of claim 14, further comprising a system bus coupled to the bridge circuit.

16. The computer system motherboard of claim 15, wherein at least one of said at least one memory socket are coupled to a memory module.

17. The computer system of claim 16, wherein the memory module comprises synchronous random access memory.

18. A method to adjust a data strobe signal comprising:
receiving a read data strobe signal and a data signal from a synchronous memory device during a memory read operation;
determining a timing characteristic between the read data strobe signal and the data signal; and
delaying the read data strobe signal based on the measured timing characteristic.

19. The method of claim 18, wherein the act of determining comprises:
delaying the read data strobe signal to generate a first signal; and
determining when the first signal transitions from a first state to a second state relative to a specified state of the data signal.

20. The method of claim 19, wherein the first-state comprises a low state, the second state comprises a high state.

21. The method of claim 20, wherein the specified state comprises a low state.

22. The method of claim 19, wherein the act of delaying the read data strobe signal comprises delaying the read data strobe signal so that the first signal transitions from the first state to the second state approximately in the middle of the time the data signal is in the specified state.

23. A method to adjust a data strobe signal comprising:
receiving a read data strobe signal and a data signal from a synchronous memory device during a memory read operation;
delaying the read data strobe signal to generate a delayed data strobe signal;
sampling the delayed data strobe signal;
sampling the data signal; and
adjusting the delaying of the data strobe signal based on the sampling of the delayed data strobe and data signals.

24. The method of claim 23, wherein the act of sampling the read data strobe signal comprises:
delaying the read data strobe signal to generate a first signal; and
determining when the first signal transitions from a first state to a second state relative to a specified state of the data signal.

25. The method of claim 24, wherein the first-state comprises a low state, the second state comprises a high state.

26. The method of claim 25, wherein the specified state comprises a low state.

27. The method of claim 24, wherein the act of delaying the read data strobe signal comprises delaying the read data strobe signal so that the first signal transitions from the first state to the second state approximately in the middle of the time the data signal is in the specified state.

* * * * *